United States Patent [19]

Fang et al.

[11] 4,274,104

[45] Jun. 16, 1981

[54] ELECTROOPTICAL INTEGRATED CIRCUIT COMMUNICATION

[75] Inventors: Frank F. Fang; Roland Y. Hung, both of Yorktown Heights, N.Y.

[73] Assignee: International Business Machines Corporation, Armonk, N.Y.

[21] Appl. No.: 41,115

[22] Filed: May 21, 1979

[51] Int. Cl.$^3$ .............................................. H01L 31/12
[52] U.S. Cl. ....................................... 357/19; 357/18; 357/30; 357/41; 250/227; 250/211 J
[58] Field of Search ....................... 357/19, 40, 17, 18, 357/41, 30; 350/96.2; 250/227, 211 J

[56] References Cited

U.S. PATENT DOCUMENTS

| | | | |
|---|---|---|---|
| 3,879,606 | 4/1975 | Bean | 250/227 |
| 3,952,265 | 4/1976 | Hunsperger | 331/94.5 H |
| 4,021,834 | 5/1977 | Epstein | 357/19 |
| 4,041,475 | 8/1977 | Javan | 250/211 J |
| 4,065,729 | 12/1977 | Gover et al. | 331/94.5 H |
| 4,137,543 | 1/1979 | Beneking | 357/30 |
| 4,169,656 | 10/1979 | Hodge | 350/96.15 |
| 4,186,994 | 2/1980 | Denkin | 350/96.17 |
| 4,212,024 | 7/1980 | Sugawara | 357/38 |
| 4,216,486 | 8/1980 | Geddes | 357/19 |

FOREIGN PATENT DOCUMENTS 1137915 12/1968 United Kingdom .
1278668  6/1972 United Kingdom .

OTHER PUBLICATIONS

Halpin et al., *I.B.M. Tech. Discl. Bull.*, vol. 15, No. 9, Feb. 1973, p. 2760.
Ury et al., *Appl. Phys. Lett.*, vol. 34, No. 7, Apr. 1979.

*Primary Examiner*—Martin H. Edlow
*Attorney, Agent, or Firm*—Alvin J. Riddles

[57] ABSTRACT

The overall performance of integrated circuit systems is enhanced by the use of optical drivers and receivers to send and receive information between the devices on the chip and between individual chips in a system. A single substrate of gallium arsenide employs both the high carrier mobility properties and the electrooptical signal conversion properties on a single substrate to provide both high performance electrical properties and high density and high performance communication properties.

6 Claims, 1 Drawing Figure

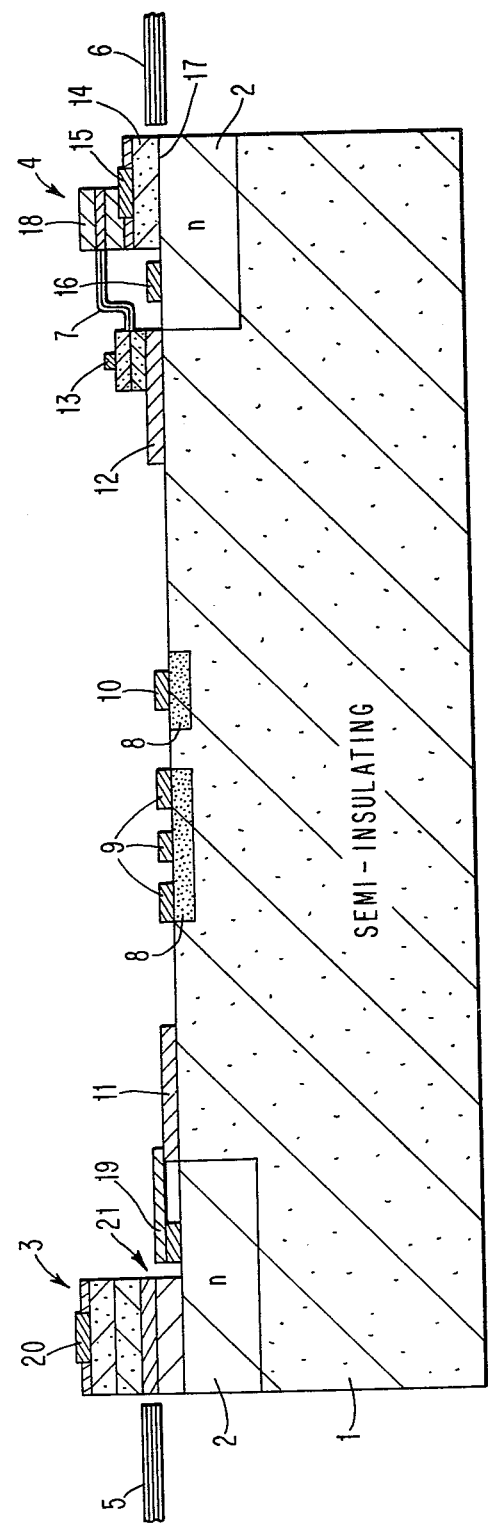

4,274,104

ELECTROOPTICAL INTEGRATED CIRCUIT COMMUNICATION

DESCRIPTION

Technical Field

The technical field of the invention is that of semiconductor integrated circuits.

In this field there has been a limitation in that the goals of providing devices with high-speed and providing the ability to communicate between arrays of devices on chips and from chip-to-chip have frequently introduced limits to the density of devices, the amount of power the devices can dissipate and the proximity with which conductors going from chip-to-chip can be positioned.

Background Art

There has been some effort in the art to improve both the speed and the power dissipation of devices through the use of the material gallium arsenide which has a higher mobility. The material gallium arsenide has a high intrinsic electron mobility which will translate into lower power dissipation which in turn provides higher density and higher switching speeds. One serious performance bottleneck, however, in an overall large scale integration system is at the "off chip" driver stages which introduce substantial propagation delays into the overall array, even though the overall "on chip" speed of the system is at least an order of magnitude higher. Hence, even with great strides in performance improvements at the "on chip" level, the overall system improvement will still be limited by off chip driver stages.

It has been known in the art that the use of optical communication techniques from chip-to-chip as is shown in U.S. Pat. No. 4,041,475 is a desirable goal. Heretofore in the art, however, a single structure providing the capabilities of high speed, high density devices and substantial power coupled with the ability to communicate optically both "on chip" and from chip-to-chip has not been available.

DESCRIPTION OF THE DRAWING

The drawing is a cross-sectional view of an example integrated circuit chip illustrating the structural features of the invention.

DISCLOSURE OF INVENTION

A gallium arsenide semiconductor integrated circuit is provided which simultaneously utilizes both the electrooptical transfer capability and carrier mobility in the material. In combination these properties result, when employed in a circuit system in which the interchip communication is through gallium arsenide electrooptical conversion, in an overall system with a data rate in the gigabit range.

An example large scale integrated system is illustrated in connection with the FIGURE wherein the electrooptical conversion of the gallium arsenide is employed in optical drivers and receivers both on the chip and also provides interchip transfer of information. The structure is adaptable to fiber optics or thin film optics for the linkage between drivers and receivers. Such a structure fundametally changes the constraint on the "off chip" drivers and thereby alleviates a serious limitation in the overall system performance. Since the optical drivers and receivers now operate at approximately the same speed as the devices, the overall system can yield a performance equivalent to the individual device performance.

The structure of the invention yields a radical simplification of the packaging requirements since the package for the large scale integration system of the invention can involve a single substrate rather than the conventional multilayer techniques used in the art. This is achieved because the crossovers when done with optical fibers are not burdened with concern for interference of electrical signals.

BEST MODE FOR CARRYING OUT THE INVENTION

The invention is illustrated in the FIGURE in a single structure having a substrate 1 which supports a device array region 2 and has "off chip" communicating capability in the form of optical drivers 3 and optical receivers 4, wherein information is sent from the optical fiber 6 to the optical receiver 4. Provision is also made for optical fiber "on chip" communication through fiber 7. The active portion of the substrate 1 may be a material which has the capabilities of exhibiting electronic carrier properties with a high mobility and at the same time has good electrooptical conversion properties. The material, gallium arsenide, will not only satisfy these requirements but also this material has the capability of exhibiting semi-insulating properties.

In the FIGURE, the substate 1 may be of gallium arsenide of the semi-insulating type having light Cr doping. Regions 2 are provided of n-conductivity type formed by diffusion or ion implantation to accommodate the "off chip" driver-receiver communication devices. Positioned within the center portion of the substrate 1, is the device array area wherein active switching elements and associated circuits reside.

As an illustrative example of the array elements of suitable dosage n-type dopant implanted regions 8 are shown to which ohmic and Schottky barrier contacts are formed, respectively, for example, producing thereby semiconductor field effect transistors 9 and diodes 10 which are positioned and wired into an array in the standard techniques known in the art. Interface circuits 11 and 12, respectively, are provided to interconnect the array, symbolically set forth by elements 9 and 10, with the optical "off chip" and "on chip" communication apparatus symbolically set forth as elements 3, 4 and 13 with fibers 5, 6 and 7.

In accordance with the invention, the electrooptical properties of the material gallium arsenide are such that high power and high efficiency in the conversion of electrical to optical signals is achieved.

Referring to element 4 consistent with physical sizes, a particularly advantageous aspect of the invention is that element 4 can be a standard gallium arsenide photodiode one region of which is a portion of the substrate 1 and the second region 14 being of opposite conductivity type, for example, p-type in the illustration shown having electrical contacts 15 and 16 on either side of the junction 17. The optical fiber 6 is adapted to transmit information from a second chip entity not shown in the overall system and is lined up to deliver the signal light to the junction 17.

Optical driving capability is illustrated in connection with element 3. The signal from the interface circuit 11 is applied via electrodes 19 and 20. A current flowing through the element 3 produces light output signal in the region 21 which, depending upon the type of application involved, may be a laser type optical cavity of the type to produce coherent light output which is transmitted via the optical fiber 5 positioned to coincide with the cavity 21. An optical conversion device of this type is particularly advantageous for driving arrays.

The signal sensed at element 15 is also used to apply a signal to a driver 18 constructed similarly to element 3 which in turn via optical fiber 7 delivers a signal over top of electrode 16 to a photo-detector 13 and thereby providing an illustration of the "on chip" crossover capability of the invention.

It will be apparent to one skilled in the art that what has been set forth are the principles of an integrated circuit electrooptical communication system and that while it has been shown with semi-insulating gallium arsenide and MESFET technology, consistent with the principles of the invention, one skilled in the art may employ a wide variety of substrate and active devices.

What has been described is a technique of formation of integrated circuits employing a gallium arsenide substrate with the property of high carrier mobility and electrooptical signal conversion employed to perform both switching, control of power dissipation and signal communication packing.

Having described the invention, what is claimed as new and what is desired to secure by Letters Patent is:

1. An integrated circuit structure comprising in combination:
   a semiconductor member of a material having at least in selected areas the semiconductor properties of both high carrier mobility and high electrooptical conversion;
   at least one optical signal output member operable to communicate information signals from said semiconductor member;
   an electrical-to-light electrooptical conversion means employing said material of said semiconductor member positioned in a discrete area of said semiconductor member adjacent to and in optical coupling relationship with each said optical signal output member;
   at least one optical signal input member operable to communicate information signals to said semiconductor member;
   an optical-to-electrical electrooptical conversion means employing the material of said semiconductor member positioned in a discrete area of said semiconductor member adjacent to and in optical coupling with each said optical signal input member; and
   at least one active semiconductor in a discrete area of said semiconductor member employing said material of said semiconductor member and operable to process signals between said at least one input and said at least one output.

2. The integrated circuit structure of claim 1 wherein said semiconductor member is gallium arsenide.

3. The integrated circuit structure of claim 1 wherein said semiconductor member is gallium arsenide that is semi-insulating containing discrete regions therein that are semiconductive.

4. The integrated circuit structure of claim 1 including at least one combination of optical-to-electrical and electrical-to-optical electrooptical conversion means employing said material of said semiconductor linked by an optical signal transport member and operable to provide information signal transfer between discrete areas of said semiconductor member.

5. The integrated circuit structure of claim 4 wherein said semiconductor member is gallium arsenide.

6. The integrated circuit structure of claim 5 wherein said semiconductor member is gallium arsenide that is semi-insulating containing discrete regions therein that are semiconductive.

* * * * *